US008447545B2

(12) United States Patent
Schalk et al.

(10) Patent No.: US 8,447,545 B2
(45) Date of Patent: May 21, 2013

(54) MODULE FOR MEASURING THE CURRENT FLOWING IN A CONDUCTOR DISTRIBUTION OF A LOW-VOLTAGE DISTRIBUTION BOARD

(75) Inventors: Adelbert Schalk, Wutoeschingen (DE); Harm Deroo, Singen OT Bohlingen (DE); Karlheinz Lutter, Blumberg (DE)

(73) Assignee: ABB Schweiz AG, Baden (CH)

( * ) Notice: Subject to any disclaimer, the term of this patent is extended or adjusted under 35 U.S.C. 154(b) by 259 days.

(21) Appl. No.: 12/851,210

(22) Filed: Aug. 5, 2010

(65) Prior Publication Data

US 2011/0040506 A1 Feb. 17, 2011

(30) Foreign Application Priority Data

Aug. 6, 2009 (EP) .................................... 09167325

(51) Int. Cl.
*G01R 19/00* (2006.01)

(52) U.S. Cl.
USPC ........................................................... 702/64

(58) Field of Classification Search
USPC ........................................................... 702/64
See application file for complete search history.

(56) References Cited

U.S. PATENT DOCUMENTS 4,411,008 A * 10/1983 d'Alayer de Costemore d'Arc et al. ............................... 377/18
6,064,289 A 5/2000 Wielock et al.
2002/0180421 A1* 12/2002 Germer et al. ................ 324/157
2011/0288575 A1* 11/2011 Colton et al. ................. 606/185

FOREIGN PATENT DOCUMENTS

| | | | |
|---|---|---|---|
| DE | 19523725 | C2 | 6/1997 |
| DE | 102006059384 | A1 | 6/2008 |
| DE | 102007006219 | A1 | 8/2008 |
| EP | 1107274 | A1 | 6/2001 |
| WO | WO 2007/100316 | A1 | 9/2007 |

OTHER PUBLICATIONS

European Search Report issued on Jan. 18, 2010, by European Patent Office as the Searching Authority for European Application No. 09167325.1.

* cited by examiner

*Primary Examiner* — Tung S Lau
(74) *Attorney, Agent, or Firm* — Buchanan Ingersoll & Rooney PC

(57) ABSTRACT

A module is provided for measuring current flowing in a conductor of a low-voltage distribution board. The module includes a current sensor for detecting the current, a microprocessor circuit for processing an output signal from the current sensor, and a module housing which accommodates the current sensor and the microprocessor circuit. The module housing has an opening for passing the current conductor, an interface with two current connections, and a connection element for releasably fastening the module in the low-voltage distribution board. To enable the module to be simply installed in the low-voltage distribution board and ensure operational reliability of the module, the passage opening extends from a side of the module housing bearing the interface, through the current measuring module, to an opposite side of the module housing, and the module is DC-isolated from the current conductor after it has been installed in the low-voltage distribution board.

23 Claims, 4 Drawing Sheets

MODULE FOR MEASURING THE CURRENT FLOWING IN A CONDUCTOR DISTRIBUTION OF A LOW-VOLTAGE DISTRIBUTION BOARD

RELATED APPLICATION

This application claims priority under 35 U.S.C. §119 to European Patent Application No. 09167325.1 filed in Europe on Aug. 6, 2009, the entire content of which is hereby incorporated by reference in its entirety.

FIELD

The present disclosure relates to a module for measuring the current flowing in a conductor of a low-voltage distribution board, and to low-voltage distribution boards having such a module.

BACKGROUND INFORMATION

A module for detecting and measuring current flowing in a conductor of a low-voltage distribution board is disclosed in DE 10 2006 059384 A1. This module has a box-like module housing in which a current sensor and a microprocessor circuit are arranged. A recess which can be used to releasably connect the module to the low-voltage distribution board is provided on the module housing. The housing has two openings through which one of two sections of a current conductor is respectively guided. Inside the housing, the two current conductor sections are respectively galvanically connected to current-carrying parts of the module via one of two current connections. On the one hand, this makes it difficult to mount the module. On the other hand, the module additionally requires space on a mounting rail or a plug-in socket of the low-voltage distribution board.

Another current measuring and current detection module is disclosed in DE 195 23 725 C2. This module is part of a low-voltage circuit-breaker which also has a three-pole switching contact arrangement with a switching mechanism. This module contains a housing with an opening through which a phase conductor of the low-voltage distribution board is guided, and the phase conductor is controlled by the switch. A current sensor, an auxiliary energy converter, and a printed circuit board with a microprocessor circuit are arranged in the housing. The microprocessor circuit processes signals emitted by the current sensor and transfers the signals to an interface for the purpose of feeding them into a bus system. The temperature and the voltage of the current conductor are also determined inside the module and are transferred to the interface. Data transferred to the interface are used, on the one hand, to control the switch and, on the other hand, for forwarding to a bus system with a central control room in which the detected values of the current carried in the current conductor or of other characteristic variables, such as voltage, temperature or power, and the corresponding data for further switches of the low-voltage distribution board can be displayed.

A current measuring module is also disclosed in DE 10 2007 006 219 A1. This module has a magnetic module for generating a potential-free output signal, which is proportional to the current to be detected, as well as an electronic module with an integrated circuit for detecting and processing the output signal from the magnetic module. In this case, the magnetic module includes a ferromagnetic toroidal core with or without an air gap. A primary conductor carrying the current is guided through the toroidal core. The toroidal core may be provided with a current-fed compensation winding or a current-supplying sensor winding. Additionally or alternatively, magnetic field probes can be used. The magnetic field probes act as current sensors and are in the form of a Hall probe or an inductive magnetic field probe. The magnetic field probes measure the strength of the magnetic flux in the air gap of the toroidal core or on the toroidal core, which magnetic flux is induced in the toroidal core by the magnetic field of the current flowing in the primary conductor.

The Smissline technical catalog “Innovativ installieren SCHUTZGERÄTE MIT STECKTECHNIK” [Innovative installation PLUG-IN PROTECTION DEVICES] by ABB Schweiz AG, Normelec, Badenerstr. 790, CH-8048 Zurich/Switzerland, describes a low-voltage distribution board in which switching and protective devices, which are each in the form of a modular DIN rail-mounted device, such as miniature circuit-breakers, residual current circuit-breakers and overvoltage and overcurrent protective devices, for example, are installed on plug-in sockets. In such low-voltage distribution boards, the current supplied from a low-voltage power supply system is distributed among different loads with the aid of the built-in devices which can be quickly installed, replaced or supplemented. Since the switches are in the form of circuit-breakers, the current-carrying loads are quickly and reliably protected from the consequences of overload and short-circuit currents. Switching and protective devices in the form of residual current circuit-breakers are even able to respond to very small residual currents in fractions of a second. Residual current circuit-breakers therefore interrupt the residual current even before risks to people and items can occur. In order to solve particular distribution problems, it may be necessary to know the magnitude of the current carried by a switching and protective device as a function of the time.

SUMMARY

An exemplary embodiment provides a module for measuring a current flowing in a conductor of a low-voltage distribution board. The exemplary module includes a current sensor configured to detect the current, a microprocessor circuit configured to process an output signal emitted by the current sensor, and a module housing which accommodates the current sensor and the microprocessor circuit. The module housing includes an opening for passing the current conductor therethrough, an interface having two current connections, which are connected to the microprocessor circuit and are connectable to an external voltage source, and a connecting element for releasably fastening the module in the low-voltage distribution board. The passage opening extends from a side of the module housing bearing the interface, through the current measuring module, to an opposite side of the module housing, and the module is configured to be DC-isolated from the current conductor after the module has been installed in the low-voltage distribution board.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
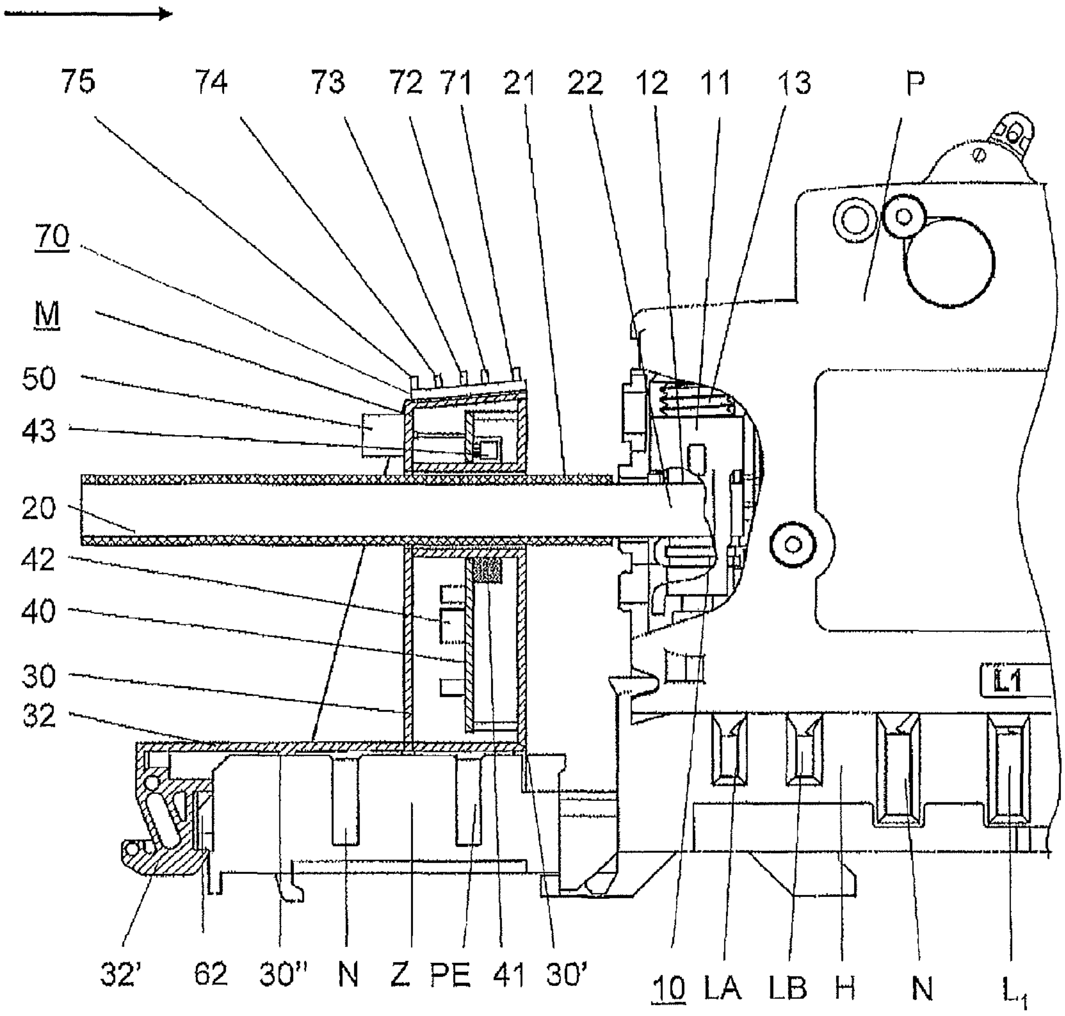
FIG. 1 shows a sectional side view of an exemplary first embodiment of a low-voltage distribution board with a switching and protective device, which is illustrated in partially broken-away form and is fastened to a main plug-in socket of the low-voltage distribution board, and with a first embodiment of the current measuring module according to the disclosure which is fastened to an additional plug-in socket of the low-voltage distribution board.

Exemplary embodiments of the present disclosure provide a current measuring module which can be installed in a low-voltage distribution board with little effort and which provides a high degree of operational reliability.

According to an exemplary embodiment of the current measuring module, a passage opening extends from a side of the module housing bearing an interface, through the current measuring module, to an opposite side of the module housing, and the module is designed in such a manner that it is DC-isolated from the current conductor after it has been installed in the low-voltage distribution board.

The exemplary current measuring module can therefore be used in low-voltage distribution boards in which switching and protective devices, which are each in the form of modular DIN rail-mounted devices, for example, and have a standardized overall width, are installed on mounting rails or plug-in sockets. Although the poles of the individual devices in such low-voltage distribution boards are in series along the rail or along the plug-in socket and are only at a short distance (e.g., less than one millimeter) from one another, the module can be arranged at the location of the current conductor without requiring additional space on due to its suitably designed opening which accommodates the current conductor. Due to the connecting element arranged on the module housing, the module can be quickly installed in the low-voltage distribution board or even removed again if necessary. In addition, a low-voltage distribution board already in operation can be retrofitted with such a module without any problems, and the design of the module ensures DC-isolation between the module and the current conductor, whereby the module is advantageously insensitive to the effect of short-circuit currents after it has been installed in the low-voltage distribution board.

According to an exemplary embodiment, if the opening is in the form of an elongated hole, a force acting on the module as a result of bending the current conductor can be reduced or even completely eliminated.

According to an exemplary embodiment, if the connecting element has a hook or a plug part with a dovetail-shaped profile, the current measuring module can be fixed to a switching and protective device or to an additional plug-in socket of the low-voltage distribution board with little mounting effort by forming a snap or plug-in connection.

According to an exemplary embodiment, if the module is intended to be releasably fastened to a switching and protective device of the low-voltage distribution board, which device has a double-level terminal with two terminal compartments for connecting current conductors, the connecting element can be in the form of a pluggable web which is oriented in the direction of the current conductor. When installing the module in the low-voltage distribution board, the web can be plugged into one of the two terminal compartments and be releasably fixed in the terminal, together with the current conductor guided through the module into the other terminal compartment, with the aid of a terminal screw, for example. Since the web is composed of insulating material and is held on the module housing, a temperature sensor which detects the terminal temperature of the switching and protective device may be arranged at that end of the web which is guided into the terminal compartment. The temperature sensor has an output which is connected to a microprocessor circuit arranged in the module via a data line accommodated in the web. In order to protect the module, which is releasably connected to the switching and protective device via the terminal web, against rotation in a particularly effective manner, a safety element which can be in the form of a pin, for example, may be arranged on the module housing, and the safety element is guided, during installation of the current measuring module, into a housing depression of the switching and protective device, where the depression can be in the form of an adjustment opening, for example.

According to an exemplary embodiment, the module can be directly fixed to the current conductor if the connecting element is in the form of a screw terminal recessed in the module housing and has a terminal screw which can be guided into the passage opening. After the module has been pushed onto the current conductor, the module can be clamped on the current conductor by tightening the terminal screw. In this case, the module housing acts as a terminal frame of the screw terminal. In order to avoid damage to the current conductor during clamping, the terminal screw made of plastic, for example. Such a terminal screw can be used to achieve a defined clamping force in a particularly simple manner.

According to an exemplary embodiment, an interface is arranged in the wall of the module housing to enable the module to be supplied with energy independently of the low-voltage distribution board. The interface has two current conduction connections which are connected to the microprocessor circuit and can be connected to an external voltage source during installation in the low-voltage distribution board. A module designed in this manner detects and then processes the current carried in the current conductor, and possibly also the temperature of the connecting terminal of the switching and protective device controlling the current conductor or another physical state variable of the current conductor or of the device, such as the voltage applied to the current conductor, for example, independently of the operating state of the low-voltage distribution board.

According to an exemplary embodiment, a display apparatus driven by the microprocessor circuit can be arranged on the surface of the module housing, to enable to the module to display the instantaneous current, for example, in amperes and/or as a percentage of the permissible rated current.

According to an exemplary embodiment, the interface can have two data line connections for transferring digital data, to thereby ensure data communication between the current measuring module or further current measuring modules of the low-voltage distribution board and a superordinate central unit.

According to an exemplary embodiment, a low-voltage distribution board having at least one of the above current measuring modules can be produced in a simple manner by releasably fastening the module to an additional plug-in socket of the low-voltage distribution board, to the DIN rail-mounted device and/or to the current conductor.

According to an exemplary embodiment, if the module contains a hook or a plug part with a dovetail-like profile and if the releasable fastening has a snap or plug-in connection which contains the hook or the plug part and in which the hook engages behind a lug and the plug part engages behind an undercut of the additional plug-in socket or of the DIN rail-mounted device in a positively locking manner, the module can be installed in the low-voltage distribution board in a particularly rapid manner. Before the current conductor is mounted, it merely has to be snapped, pushed or plugged onto the DIN rail-mounted device, which is generally in the form of a switching and protective device, or the additional socket.

According to an exemplary embodiment, if the module has a pluggable web which is oriented in the direction of the current conductor, the module can be releasably fastened to the DIN rail-mounted device in a particularly firm manner by means of a clamping connection which contains the pluggable web. This concerns, in particular, a low-voltage distribution board having a DIN rail-mounted device with a double-level terminal. The web can then be arranged only in the first of the two terminal compartments of the double-level terminal, and the current conductor can be arranged in the second terminal compartment of the double-level terminal, where the second terminal compartment can be used as the current connection of the DIN rail-mounted device. The two parts can then be quickly fixed by tightening a terminal screw and the current measuring module can thus be fixed in the low-voltage distribution board.

According to an exemplary embodiment, if the low-voltage distribution board does not contain an additional plug-in socket or if the DIN rail-mounted device does not have a favorable fastening option, the current measuring module can nevertheless be fastened in the low-voltage distribution board without any problems if the connecting element is in the form of a screw terminal recessed in the module housing and has a clamping screw which can be guided into the passage opening of the module. The releasable fastening can then be achieved by means of a clamping connection which contains the screw terminal and in which the module is fixed by clamping the current conductor in the screw terminal.

In an exemplary embodiment of the low-voltage distribution board, the current measuring module has an interface with two current connections for connecting an external voltage source and two connections for transferring digital data. A communication module which is arranged in the low-voltage distribution board and is connected to the interface by means of a bus system can then connect the current measuring module to an external voltage source and can then also simultaneously preprocess the digital data transferred by the current measuring module and can transfer said data to a standardized protocol (e.g., WLAN, KNX, Profibus or Powerbus) or any customer-specific protocol.

The same reference symbols used in the drawings relate to identical parts and/or identically functioning parts. The low-voltage distribution board illustrated in FIGS. 1 and 2 has a main plug-in socket H and an additional plug-in socket Z which is rigidly connected to the main plug-in socket H. Busbars N, $L_1$, . . . are mounted in the main plug-in socket H. The busbars N, $L_1$, . . . are connected to a neutral conductor and to phase conductors of a three-phase system and each feed into a pole of a multipole switching and protective device, which is fastened to the main plug-in socket H. In addition, the main plug-in socket H supports auxiliary busbars LA and LB which are configured to jointly supply signal and auxiliary contacts of the switching and protective device and additional DIN rail-mounted devices arranged on the main plug-in socket H. Only the switch pole P which is connected to the busbar $L_1$ and is accordingly also connected to the phase conductor $L_1$ is illustrated in FIG. 1 as being representative of the DIN rail-mounted devices. The busbars N and PE assigned to the neutral conductor and to a protective conductor of the three-phase system are arranged in the additional plug-in socket Z. All of the busbars are parallel in a plane and are oriented perpendicular to the plane of the drawing.

The switch pole P has a connecting terminal 10 with a terminal frame 11 (illustrated in broken-away form) and a clamping screw 13 which projects into a terminal compartment 12. A current conductor 20 which branches off from the switch pole P at a load (not illustrated) is fixed in the terminal compartment 12 by its end 22 which is kept free of the conductor insulation 21.

Figure 2:
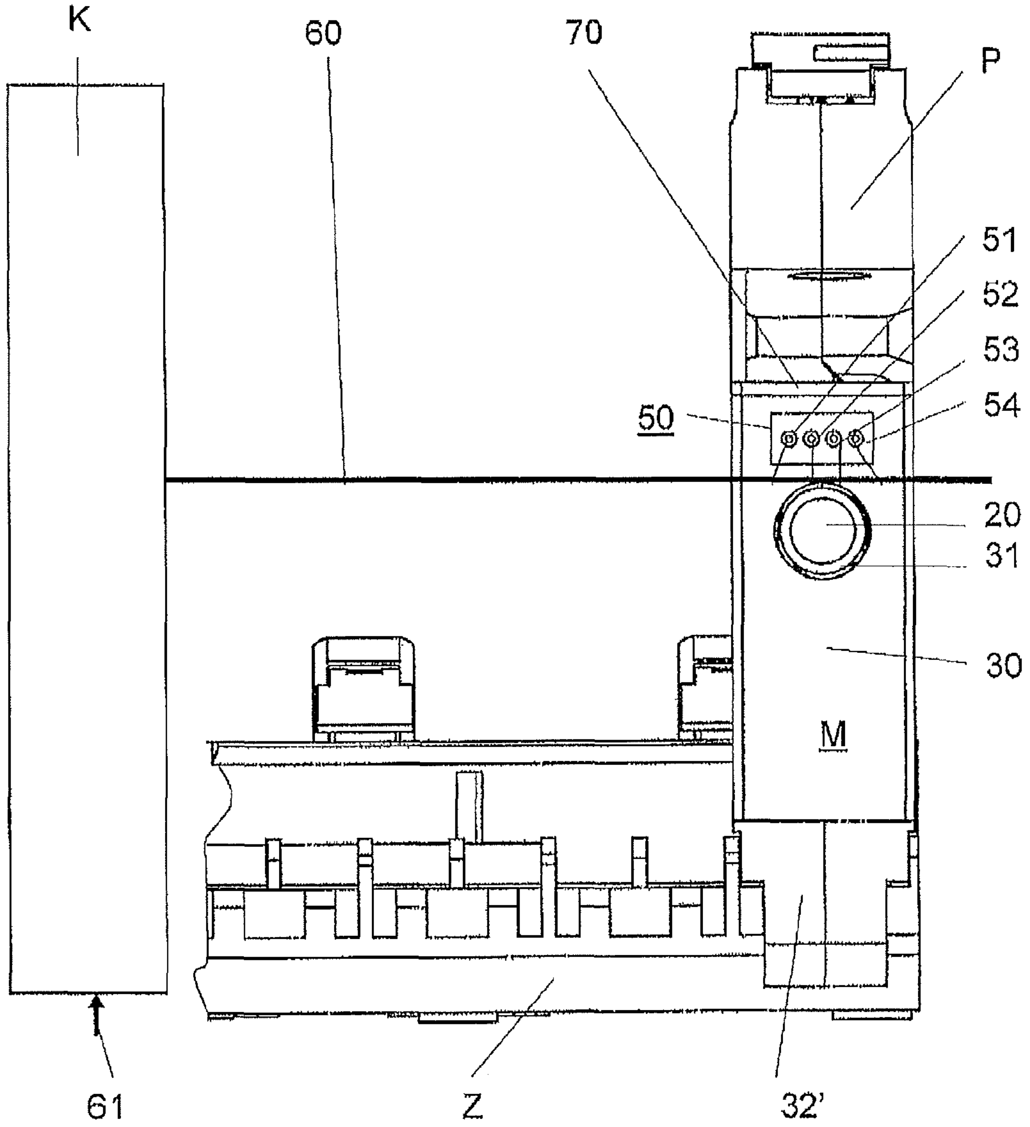
FIG. 2 shows a view of the low-voltage distribution board according to FIG. 1 from the left in the direction of the arrow.

The reference symbol M is used to denote a current measuring module which can also be seen in FIG. 2. This module has a module housing 30 which can be in the form of a box, for example. The module housing 30 has an opening 31 (see FIG. 2) formed therein. The opening 31 is configured to pass the current conductor 20 therethrough. According to an exemplary embodiment, the opening 31 can be circular or predominantly elliptical in the manner of an elongated hole, for example. Since the current conductor 20 generally has to be bent downward on account of the topology of the low-voltage distribution board on the rear side of the switching and protective device P or the rear side of the current measuring module M, where the rear side has the connecting terminal 10, more space is now available in the elongated hole for the current conductor 20 which is guided through the elongated hole, and a force acting on the module M as a result of the bending of the current conductor can thus be reduced or even completely eliminated.

According to an exemplary embodiment illustrated in FIG. 2, the module housing 30 can be as broad as the switch pole P along the additional plug-in socket Z and perpendicular to the direction of the current conductor 20. The module housing 30 is closed in such a manner that it is protected from contact and, as illustrated in the exemplary embodiment of FIG. 1, accommodates a printed circuit board 40 which is oriented perpendicular to the direction of the current conductor 20 and the passage opening. A ferromagnetic toroidal core 41, which surrounds the current conductor 20 in a largely coaxial manner, and a microprocessor circuit 42 are arranged on the printed circuit board 40. A current sensor 43, which can be in the form of a Hall probe or a magnetic probe, for example, and whose output is connected to the microprocessor circuit 42 in a current-conducting manner, is arranged in a slot which is axially guided through the toroidal core 41. The microprocessor circuit 42 can be connected to two data line connections 51 and 52 (as illustrated in FIG. 2) of an interface 50 held on the module housing 30. As can be gathered from FIG. 2, the interface 50 also contains two current connections 53 and 54. These current connections 53 and 54 are, on the one hand, connected to the microprocessor circuit 42 and to the current sensor 43 and, on the other hand, to an external voltage source 61, which can provide a 12 V or 24 V direct current, for example, via a bus 60, which can be seen in FIG. 2 and contains two data lines and two current conductors, and a communication module K. Since the module 30 only detects the magnetic field of the current flowing in the current conductor 20 via the ferromagnetic toroidal core 41, the module 30 is DC-isolated from the current conductor 20 and is insensitive to the effect of short-circuit currents.

As illustrated in FIG. 1, for example, a web 32, which is strengthened by means of a rib in the module housing 30, is fitted to the underside of the module housing 30. A snap hook 32', which can be pivoted by means of elastic deformation of the web 32, is formed in the free end of the web 32. The snap hook 32' engages behind a lug 62 of the additional plug-in socket Z.

When installing the current measuring module M, the current conductor 20 can be disconnected from the connecting terminal 10. The current measuring module M can then be placed, with an edge 30' of the module housing 30 facing the switch pole P of the switching and protective device, onto the additional plug-in socket Z and then tilted downward in the anticlockwise direction around the edge 30' until the snap hook 32' engages behind the lug 62 of the additional plug-in socket Z. As a result of the snap hook 32' and a narrow web 30" of the module housing 30, which is integrally formed on the module housing 30 and is recessed in the additional plug-in socket Z after being snapped on, the module M is fixed on the additional plug-in socket Z when snapping the snap hook 32' onto the lug 62. The current conductor 20 can then be guided through the opening 31 into the terminal compartment 12 of the connecting terminal 10 and be fixed by actuating the clamping screw 13.

During operation of the low-voltage distribution board, the voltage source 61 is connected to the current connections 53, 54 via the communication module K and the bus 60, and thus supplies the current sensor 43 and the microprocessor circuit 42 with operating current. Current flowing through the current conductor 20 to the load is detected with the aid of the current sensor 43. The output signals from the current sensor 43 are passed to the microprocessor circuit 42 and are processed further there in the form of digital signals. Data which correspond to the current load of the current conductor 20 are thus formed in the current measuring module M. This current load can be displayed on a display apparatus 70 which is controlled by the microprocessor circuit 42 and is arranged on a top face of the module housing 30, which face points upward (e.g., facing away from the module housing 30 so as to be visible). According to an exemplary embodiment, the measured current can be compared with the permissible rated current, and the current load can be determined as a percentage of the permissible rated current. If the current load exceeds a limit value, the display apparatus 70 can indicate this determination. According to an exemplary embodiment, a particularly simple and nevertheless effective display apparatus can be implemented with the aid of light-emitting diodes 71 to 75 which are arranged along a straight line such that they are uniformly distributed in the display apparatus 70. Each of these light-emitting diodes is activated in a particular percentage range which is respectively 20% in the case of 5 light-emitting diodes, for example. In the case of a current load of between 0 and 20% of the rated current, the light-emitting diode 71 accordingly signals; in contrast, the light-emitting diodes 72, 73, 74 and 75 arranged downstream signal in a current load range which has been respectively increased by 20%. For example, the light-emitting diode 73 signals in a range between 40 and 60% and the light-emitting diode 75 signals in a range between 80 and 100%. Since the light-emitting diode 75 already signals in a critical range of the current load, the light-emitting diode 75 emits a warning signal and therefore, in contrast to the other four light-emitting diodes 71 to 74, is illuminated red rather than green, for example.

According to an exemplary embodiment, the current measuring module M can be configured to operate independently of externally supplied data, in which case the module M then does not require the data line connections 51 and 52.

However, if the digital measured values determined by the current measuring module M are intended to be forwarded, they are transferred, at the interface 50, to the bus 60 via the data line connections 51, 52 and are passed to the communication module K in which they are transferred to a standardized protocol (WLAN, KNX, Profibus or Powerbus) or any customer-specific protocol.

Figure 3:
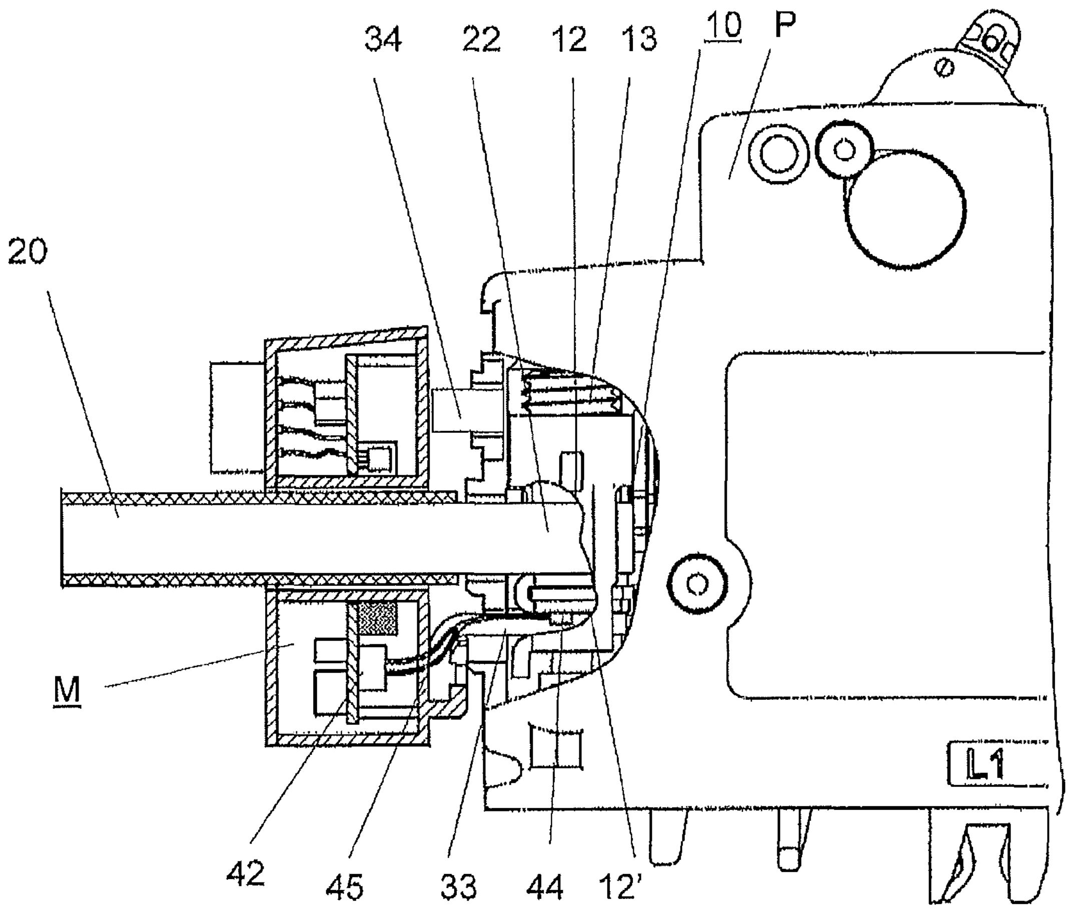
FIG. 3 shows a side view of a second exemplary embodiment of a low-voltage distribution board in which a second exemplary embodiment of the current measuring module according to the disclosure is fastened to a switching and protective device with the aid of a clamping connection.

In the exemplary embodiment of the low-voltage distribution board illustrated in FIG. 3, the current measuring module M is fastened to a switch pole P of a switching and protective device. According to the exemplary embodiment illustrated in FIG. 3., the connecting terminal 10 is a double-level terminal and also has the terminal compartment 12' in addition to the terminal compartment 12. The connecting element fitted to the module housing 30 can, for example, be in the form of a pluggable web 33 which is oriented in the direction of the current conductor 20. When installing the module M in the low-voltage distribution board, the web 33 (after removing the current conductor 20) can be plugged into the terminal compartment 12' and, after the current conductor 20 has been passed through the current measuring module M, that end 22 of the current conductor from which the insulation has been stripped can be plugged into the terminal compartment 12. Both the current conductor 20 and the current measuring module M can then be fixed to the connecting terminal 10 with the aid of the terminal screw 13. Since the web 33 and the module housing 30 are composed of insulating material and since the web 33 is held on the module housing 30 or is formed in the module housing 30, a temperature sensor 44 (see FIG. 3) can be arranged at that end of the web 33 which is guided into the terminal compartment 12'. The temperature sensor 44 detects the temperature of the connecting terminal 10 of the switch pole P and has an output which is connected to the microprocessor circuit 42 via a data line 45 fitted to the web 33. A safety element 34 in the form of a pin can be arranged on the module housing 30 to additionally protect the module M from rotation.

Figure 4:
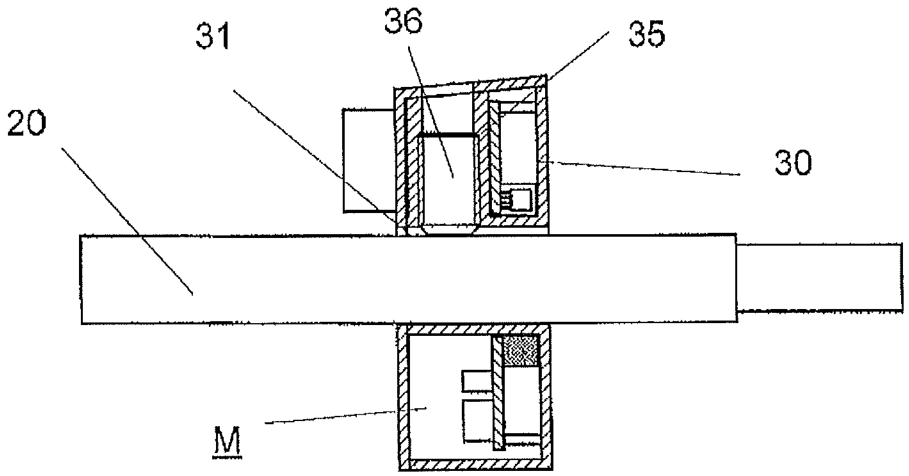
FIG. 4 shows a sectional side view of a third exemplary embodiment of the current measuring module according to the disclosure which is fastened to a current conductor of a low-voltage distribution board.

FIG. 4 shows a part of a low-voltage distribution board which has neither an additional plug-in socket nor a switch pole with a suitable option for fastening the current measuring module M. The module can nevertheless be fastened in the low-voltage distribution board without any problems if the connecting element for releasably fastening the module M in the low-voltage distribution board is in the form of a screw terminal 35 recessed in the module housing 30 and has a clamping screw 36 which can be guided into the passage opening 31 of the module M. The releasable fastening can then be achieved by means of a clamping connection which contains the screw terminal 35 and in which the module M is fixed by clamping the current conductor in the screw terminal 35.

Figure 5:
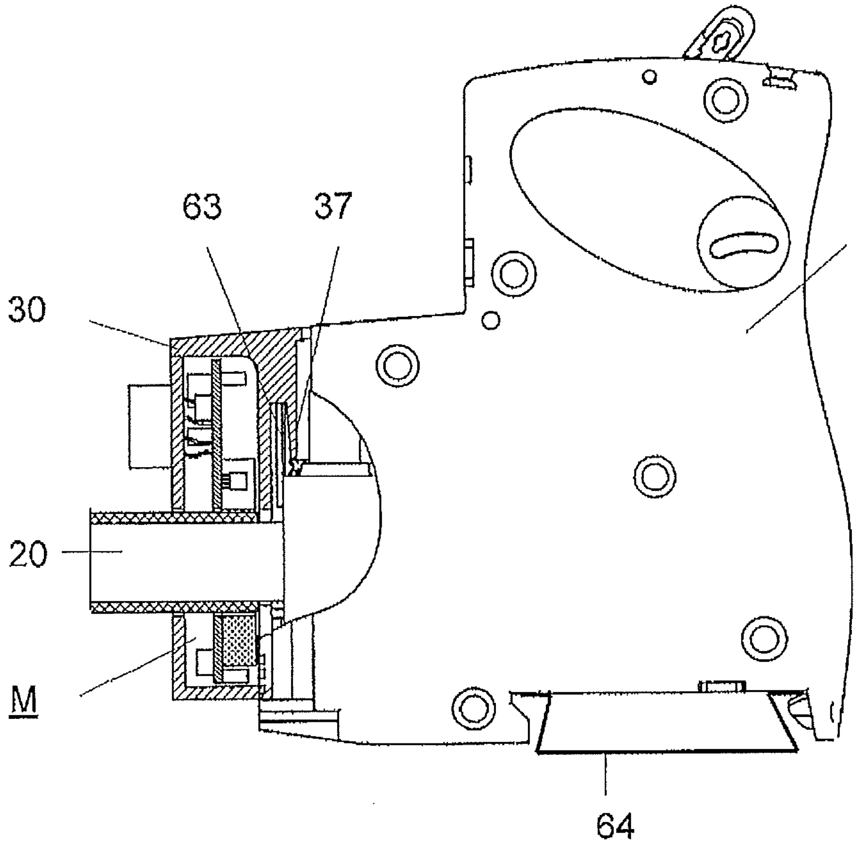
FIG. 5 shows a side view of a third exemplary embodiment of a low-voltage distribution board in which a fourth exemplary embodiment of the current measuring module according to the disclosure is fastened to a switching and protective device held on a mounting rail with the aid of a plug-in connection.

In the exemplary embodiment illustrated in FIG. 5, a plug part 37 with a dovetail-like profile is formed in the module housing 30. The plug part 37 is pushed from above into an undercut 63 of the switch pole P, which is held on a mounting rail 64, when installing the module M in the low-voltage distribution board. As a result of the plug-in connection formed in this manner, the module M is likewise releasably fastened in the low-voltage distribution board.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

H Main plug-in socket
Z Additional plug-in socket
N, $L_1$, . . . , PE Busbars
LA, LB Auxiliary busbars
M Current measuring module
P Switch pole of a switching and protective device
B Bus
K Communication module
10 Connecting terminal
11 Terminal frame
12, 12' Terminal compartments
13 Terminal screw
20 Current conductor
21 Conductor insulation
22 End of the current conductor from which the insulation has been stripped
30 Module housing
30' Edge
30" Web
31 Passage opening
32 Web
32' Snap hook
33 Web
34 Safety element
35 Screw terminal
36 Clamping screw
37 Plug part with a dovetail-like profile
40 Printed circuit board
41 Toroidal core
42 Microprocessor circuit
43 Current sensor
44 Temperature sensor
45 Data line
50 Interface
51, 52 Data line connections
53, 54 Current connections
60 Bus
61 Voltage source
62 Lug
63 Undercut
64 Mounting rail
70 Display apparatus
71, 72, 73, 74, 75 Light-emitting diodes

What is claimed is:

1. A module for measuring a current flowing in a conductor of a low-voltage distribution board, the module comprising:

a current sensor configured to detect the current;

a microprocessor circuit configured to process an output signal emitted by the current sensor; and a module housing which accommodates the current sensor and the microprocessor circuit, wherein the module housing includes an opening for passing the current conductor therethrough, an interface having two current connections, which are connected to the microprocessor circuit and are connectable to an external voltage source that provides up to 24V direct current, and a connecting element for releasably fastening the module in the low-voltage distribution board, and wherein the opening extends from a side of the module housing bearing the interface, through the current measuring module, to an opposite side of the module housing, and the module is configured to be DC-isolated from the current conductor after the module has been installed in the low-voltage distribution board.

2. The module as claimed in claim 1, wherein the opening is in the form of an elongated hole.

3. The module as claimed in claim 1, wherein the connecting element is in the form of a hook.

4. The module as claimed in claim 1, wherein the connecting element is in the form of a pluggable web which is oriented in the direction of the current conductor.

5. The module as claimed in claim 4, comprising:

a temperature sensor arranged in the web and having an output which is connected to the microprocessor circuit.

6. The module as claimed in claim 4, comprising:

a pluggable safety element arranged on the module housing.

7. The module as claimed in claim 1, wherein the connecting element is in the form of a screw terminal recessed in the housing, and the connecting element has a clamping screw which is configured to be guided into the opening.

8. The module as claimed in claim 1, comprising:

a display apparatus arranged in a surface of the module housing and being configured to be driven by the microprocessor circuit.

9. The module as claimed in claim 1, wherein the interface comprises two data line connections for transferring digital data.

10. A low-voltage distribution board having a current measuring module as claimed in claim 1, wherein the module is configured to be releasably fastened to one of an additional plug-in socket of the low-voltage distribution board, a DIN rail-mounted device, and the current conductor.

11. The low-voltage distribution board as claimed in claim 10, wherein:

the connecting element is in the form of a hook; and the releasable fastening has a snap connection which contains the hook and in which the hook engages behind a lug.

12. The low-voltage distribution board as claimed in claim 10, wherein:

the connecting element is in the form of a pluggable web which is oriented in the direction of the current conductor;

the releasable fastening has a clamping connection which contains the pluggable web and in which the web is arranged in a first one of two terminal compartments of a double-level terminal of the DIN rail-mounted device; and the current conductor is arranged in a second one of the two terminal compartments of the double-level terminal, which is configured as a current connection of the DIN rail-mounted device, and is fixed via a terminal screw.

13. The low-voltage distribution board as claimed in claim 10, wherein:

the connecting element is in the form of a screw terminal recessed in the housing and has a clamping screw which is configured to be guided into the opening of the module; and the releasable fastening has a clamping connection which contains the screw terminal and in which the module is fixed by clamping the current conductor in the screw terminal.

14. The low-voltage distribution board as claimed in claim 11, wherein:

the module has an interface which includes two current connections and two connections for transferring digital data; and the distribution board has a communication module which is connected to the interface, and is configured to connect the current measuring module to an external voltage source, preprocess the digital data transferred by the current measuring module and transfer the data to an optionally standardized protocol.

15. The module as claimed in claim 1, wherein the module housing is formed in a box-like shape.

16. The module as claimed in claim 1, wherein the connecting element is in the form of a plug part with a dovetail-like profile.

17. The module as claimed in claim 5, comprising:

a pluggable safety element arranged on the module housing.

18. The module as claimed in claim 1, wherein the clamping screw is comprised of plastic.

19. The module as claimed in claim 2, wherein the connecting element is in the form of a screw terminal recessed in the housing, and the connecting element has a clamping screw which is configured to be guided into the opening.

20. The module as claimed in claim 19, wherein the clamping screw is comprised of plastic.

21. The module as claimed in claim 8, wherein the display apparatus comprises light-emitting diodes.

22. The low-voltage distribution board as claimed in claim 10, wherein:

the connecting element is in the form of a plug part with a dovetail-like profile; and the releasable fastening has a plug-in connection which contains the plug part and in the plug part engages behind an undercut of one of the additional plug-in socket and the DIN rail-mounted device in a positively locking manner.

23. The low-voltage distribution board as claimed in claim 12, wherein:

the module has an interface which includes two current connections and two connections for transferring digital data; and the distribution board has a communication module which is connected to the interface, and is configured to connect the current measuring module to an external voltage source, preprocess the digital data transferred by the current measuring module and transfer the data to an optionally standardized protocol.

* * * * *